(12) United States Patent
Martirosyan et al.

(10) Patent No.: US 9,350,395 B2
(45) Date of Patent: May 24, 2016

(54) TRANSMITTING CIRCUIT AND TRANSCEIVER SYSTEM INCLUDING THE SAME

(71) Applicant: Samsung Electronics Co., Ltd., Suwon-si, Gyeonggi-do (KR)

(72) Inventors: Aram Martirosyan, Yongin-si (KR); Jong-Shin Shin, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/561,189

(22) Filed: Dec. 4, 2014

(65) Prior Publication Data

US 2015/0222301 A1    Aug. 6, 2015

(30) Foreign Application Priority Data

Feb. 6, 2014   (KR) .................. 10-2014-0013425

(51) Int. Cl.
  *H04L 25/03*  (2006.01)
  *H04B 1/04*  (2006.01)
  *H04B 1/40*  (2015.01)

(52) U.S. Cl.
  CPC .............. *H04B 1/0475* (2013.01); *H04B 1/40* (2013.01)

(58) Field of Classification Search
  CPC .... H04B 1/0475; H04B 1/40; G06F 13/4086; G06F 1/3203; H04L 25/0266; H04L 25/0272; H04L 2025/03356
  USPC ...................................................... 375/296
  See application file for complete search history.

(56) References Cited

U.S. PATENT DOCUMENTS

| | | | |
|---|---|---|---|
| 6,665,347 B2 | 12/2003 | Van et al. | |
| 7,639,746 B2 | 12/2009 | Cornelius et al. | |
| 7,643,563 B2 | 1/2010 | Huang et al. | |
| 7,817,727 B2 | 10/2010 | Kumar et al. | |
| 7,949,041 B2 | 5/2011 | Zerbe et al. | |
| 7,984,321 B2 | 7/2011 | Shibata et al. | |
| 8,358,156 B1 * | 1/2013 | Abugharbieh | H03K 19/017554 327/108 |
| 8,441,281 B2 | 5/2013 | Kothandaraman et al. | |
| 8,446,173 B1 | 5/2013 | Faucher et al. | |
| 8,520,348 B2 | 8/2013 | Dong | |

FOREIGN PATENT DOCUMENTS

| | | |
|---|---|---|
| KR | 100716687 B1 | 5/2007 |
| KR | 20090006339 A | 1/2009 |
| KR | 20110108983 A | 10/2011 |

* cited by examiner

*Primary Examiner* — David S Huang
(74) *Attorney, Agent, or Firm* — Renaissance IP Law Group LLP

(57) ABSTRACT

A transmitting circuit includes a positive differential node, a negative differential node, a voltage mode driver, and a current mode driver. The voltage mode driver generates a first positive differential signal and a first negative differential signal. The voltage mode driver provides the first positive differential signal to the positive differential node and provides the first negative differential signal to the negative differential node. The current mode driver generates a second positive differential signal and a second negative differential signal. The current mode driver provides the second positive differential signal to the positive differential node and provides the second negative differential signal to the negative differential node. A differential signal voltage swing width between the positive differential node and the negative differential node is based at least on the operational state of the current mode driver and/or the voltage mode driver.

20 Claims, 8 Drawing Sheets

TRANSMITTING CIRCUIT AND TRANSCEIVER SYSTEM INCLUDING THE SAME

CROSS-REFERENCE TO RELATED APPLICATION

This U.S. Non-provisional application claims priority under 35 USC §119 to Korean Patent Application No. 10-2014-0013425, filed on Feb. 6, 2014, in the Korean Intellectual Property Office (KIPO), the disclosure of which is incorporated by reference in its entirety herein.

BACKGROUND

1. Technical Field

Example embodiments relate generally to a transceiver system, and more particularly to a transmitting circuit capable of generating a high-swing signal with low power consumption, and a transceiver system including the transmitting circuit.

2. Discussion of the Related Art

With the development of Complimentary Metal-Oxide-Semiconductor (CMOS) manufacturing processes, driving voltage of electronic circuits has decreased. In general, the driving voltage level of a typical CMOS circuit is equal to or less than 1 Volt (V). Some applications such as widely-used high-speed data transmitting/receiving interfaces require a swing width of a differential signal that is greater than 1 V. For example, Peripheral Component Interconnect PCI express (PCIe) technology requires a swing width of a differential signal that is greater than 1.2 V.

In general, to generate an output signal having a larger swing width than a difference between a driving voltage and a ground voltage, a conventional CMOS transceiver circuit uses a high driving voltage corresponding to the larger swing width. In this case, the high driving voltage, which is higher than the upper limit driving voltage, may cause break down of the CMOS transceiver circuit.

SUMMARY

At least one example embodiment of the inventive concept provides a transmitting circuit generating high swing signal with low power consumption.

At least one example embodiment of the inventive concept provides a transceiver system including a transmitting circuit generating high swing signal with low power consumption.

According to example embodiments, a transmitting circuit may include a positive differential node and a negative differential node, a voltage mode driver connected to the positive differential node and to the negative differential node, and configured to generate a first positive differential signal and a first negative differential signal, based at least on an input signal, by using a driving voltage source, the voltage mode driver configured to provide the first positive differential signal to the positive differential node and to provide the first negative differential signal to the negative differential node, and a current mode driver connected to the positive differential node and to the negative differential node, and configured to generate a second positive differential signal and a second negative differential signal, based at least on the input signal, by using a first current source and a second current source, the current mode driver configured to provide the second positive differential signal to the positive differential node and to provide the second negative differential signal to the negative differential node.

Responsive to both the current mode driver and the voltage mode driver operating, the positive differential node and the negative differential node may have a differential signal voltage swing width between the positive differential node and the negative differential node that may be greater than a voltage difference between the driving voltage source and a ground node.

Responsive to one of the current mode driver or the voltage mode driver operating, the positive differential node and the negative differential node may have the differential signal voltage swing width between the positive differential node and the negative differential node that may be equal to or less than the voltage difference between the driving voltage source and the ground node.

In an example embodiment, the current mode driver may include a first switch, a second switch, a third switch, and a fourth switch. In some embodiments, a terminal of the first switch may be connected to the first current source, and another terminal of the first switch may be connected to the positive differential node. In some embodiments, a terminal of the second switch may be connected to the first current source, and another terminal of the second switch may be connected to the negative differential node. In some embodiments, a terminal of the third switch may be connected to the second current source, and another terminal of the third switch may be connected to the positive differential node. In some embodiments, a terminal of the fourth switch may be connected to the second current source, and another terminal of the fourth switch may be connected to the negative differential node.

In an example embodiment, the first and fourth switches may operate based at least on the input signal, and the second and third switches may operate based at least on an inverted signal of the input signal.

In an example embodiment, each of the first, second, third, and fourth switches may include a transistor whose gate terminal receives the input signal or the inverted signal of the input signal.

In an example embodiment, the voltage mode driver may include a first switch, a second switch, a third switch, and a fourth switch. In some embodiments, a terminal of the first switch may be connected to the driving voltage source through a first variable resistor, and another terminal of the first switch may be connected to the positive differential node. In some embodiments, a terminal of the second switch may be connected to the ground node through a second variable resistor, and another terminal of the second switch may be connected to the positive differential node. In some embodiments, a terminal of the third switch may be connected to the driving voltage source through a third variable resistor, and another terminal of the third switch may be connected to the negative differential node. In some embodiments, a terminal of the fourth switch may be connected to the ground node through a fourth variable resistor, and another terminal of the fourth switch may be connected to the negative differential node.

In an example embodiment, each of the first, second, third, and fourth switches may include a transistor.

In an example embodiment, the first and fourth switches may operate based at least on the input signal, and the second and third switches may operate based at least on an inverted signal of the input signal.

In an example embodiment, resistances of the first, second, third, and fourth variable resistors are configured to change based at least on a control signal.

In an example embodiment, responsive to the current mode driver not operating and the voltage mode driver operating, the positive differential node and the negative differential node are configured to have the differential signal voltage swing width between the positive differential node and the negative differential node that may be equal to or less than the voltage difference between the driving voltage source and the ground node.

According to example embodiments, a transceiver system may include a receiving circuit and a transmitting circuit. In some embodiments, the transmitting circuit may include a positive differential node and a negative differential node, a voltage mode driver connected to the positive differential node and to the negative differential node, and configured to generate a first positive differential signal and a first negative differential signal, based at least on an input signal, by using a driving voltage source, the voltage mode driver configured to provide the first positive differential signal to the positive differential node and to provide the first negative differential signal to the negative differential node, and a current mode driver connected to the positive differential node and to the negative differential node, and configured to generate a second positive differential signal and a second negative differential signal, based at least on the input signal, by using a first current source and a second current source, the current mode driver configured to provide the second positive differential signal to the positive differential node and to provide the second negative differential signal to the negative differential node.

In an example embodiment, responsive to both the current mode driver and the voltage mode driver operating, the positive differential node and the negative differential node are configured to have a differential signal voltage swing width between the positive differential node and the negative differential node that may be greater than a voltage difference between the driving voltage source and a ground node.

In an example embodiment, responsive to one of the current mode driver or the voltage mode driver operating, the positive differential node and the negative differential node are configured to have the differential signal voltage swing width between the positive differential node and the negative differential node that may be equal to or less than the voltage difference between the driving voltage source and the ground node. The receiving circuit may be connected to the positive differential node and the negative differential node.

In an example embodiment, the voltage mode driver may include a first, a second, a third, and a fourth switches. In some embodiments, a terminal of the first switch may be connected to the driving voltage source through a first variable resistor, and another terminal of the first switch may be connected to the positive differential node. In some embodiments, a terminal of the second switch may be connected to the ground node through a second variable resistor, and another terminal of the second switch may be connected to the positive differential node. In some embodiments, a terminal of the third switch may be connected to the driving voltage source through a third variable resistor, and another terminal of the third switch may be connected to the negative differential node. In some embodiments, a terminal of the fourth switch may be connected to the ground node through a fourth variable resistor, and another terminal of the fourth switch may be connected to the negative differential node.

In an example embodiment, resistances of the first, second, third, and fourth resistors are configured to be controlled, based at least on a control signal, to achieve impedance-matching with a resistance of the receiving circuit.

According to example embodiments, a transmitting circuit may include a driving voltage source, a ground node, a positive differential node, a negative differential node, a voltage mode driver connected to the positive differential node and to the negative differential node, and a current mode driver connected to the positive differential node and to the negative differential node.

In an example embodiment, responsive to both the current mode driver and the voltage mode driver operating, the positive differential node and the negative differential node are configured to have a differential signal voltage swing width between the positive differential node and the negative differential node that may be greater than a voltage difference between the driving voltage source and the ground node.

In an example embodiment, responsive to only one of the current mode driver or the voltage mode driver operating, the positive differential node and the negative differential node are configured to have the differential signal voltage swing width between the positive differential node and the negative differential node that may be equal to or less than the voltage difference between the driving voltage source and the ground node.

In an example embodiment, the current mode driver may include a first current source, a second current source, a first switch, a second switch, a third switch, and a fourth switch. In some embodiments, a terminal of the first switch may be connected to the first current source, and another terminal of the first switch may be connected to the positive differential node. In some embodiments, a terminal of the second switch may be connected to the first current source, and another terminal of the second switch may be connected to the negative differential node. In some embodiments, a terminal of the third switch may be connected to the second current source, and another terminal of the third switch may be connected to the positive differential node. In some embodiments, a terminal of the fourth switch may be connected to the second current source, and another terminal of the fourth switch may be connected to the negative differential node.

As described above, a transmitting circuit and/or a transceiver system including the same according to example embodiments, may generate an output differential signal, which has larger swing width than a difference between a driving voltage and a ground voltage, by using a voltage mode driver and a current mode driver simultaneously with low power consumption.

BRIEF DESCRIPTION OF THE DRAWINGS

Example embodiments of the inventive concept will be more clearly understood from the following detailed description taken in conjunction with the accompanying drawings.

DETAILED DESCRIPTION OF THE EMBODIMENTS

Figure 1:
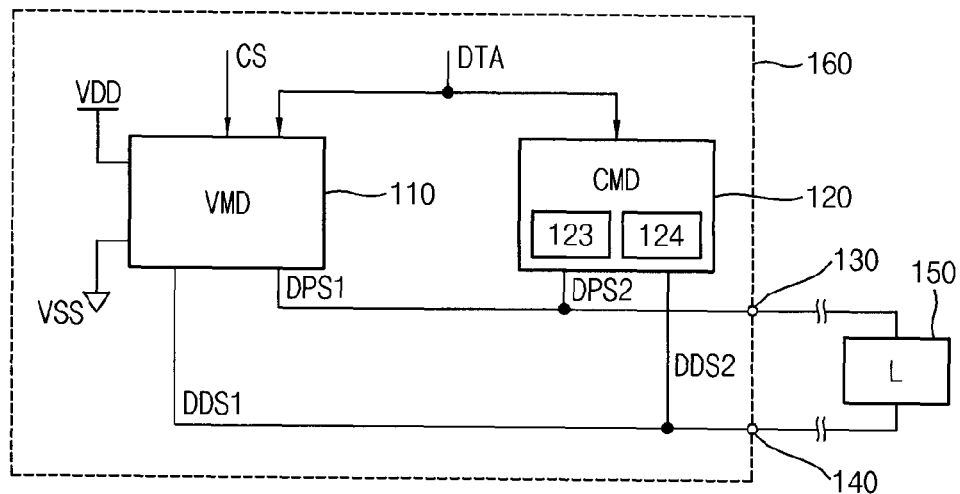
FIG. 1 is a block diagram illustrating a transceiver system according to an example embodiment.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third, etc., may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality and/or acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a transceiver system according to an example embodiment.

Referring to FIG. 1, a transceiver system 100 includes a transmitting circuit 160 and a receiving circuit 150. The transmitting circuit 160 includes a positive differential node 130, a negative differential node 140, a voltage mode driver VMD 110, and a current mode driver CMD 120. The voltage mode driver 110 may generate a first positive differential signal DPS1 and a first negative differential signal DDS1, based at least on an input signal DTA, by using a driving voltage source VDD. The voltage mode driver 110 may provide the first positive differential signal DPS1 to the positive differential node 130. In addition, the voltage mode driver 110 may provide the first negative differential signal DDS1 to the negative differential node 140.

The current mode driver 120 may generate a second positive differential signal DPS2 and a second negative differential signal DDS2, based at least on the input signal DTA, by using a first current source 123 and a second current source 124. The current mode driver 120 may provide the second positive differential signal DPS2 to the positive differential node 130. In addition, the current mode driver 120 may provide the second negative differential signal DDS2 to the negative differential node 140.

In some embodiments, a first voltage difference between the positive differential node 130 and the negative differential node 140 is greater than a second voltage difference between the driving voltage source VDD and the ground node VSS responsive to both the current mode driver 120 and the voltage mode driver 110 operating. The term "operating" can mean actively producing one or more differential signals and/or operating according to an operational mode, as further described below. In some embodiments, the first voltage difference is equal to or less than the second voltage difference responsive to one of the current mode driver 120 or the voltage mode driver 110 operating. For example, the first voltage difference is equal to or less than the second voltage difference responsive to only the voltage mode driver 110 operating, but the current mode driver 120 not operating. By way of another example, the first voltage difference is equal to or less than the second voltage difference responsive to only the current mode driver 120 operating, but the voltage mode driver 110 not operating. The receiving circuit 150 may be connected to the positive differential node 130 and the negative differential node 140.

Resistances of the voltage mode driver 110 may be changed based at least on a control signal CS. The resistances of the voltage mode driver 110 may be controlled, based at least on the control signal CS, to achieve impedance-matching with a resistance of the receiving circuit 150.

The voltage mode driver 110 is further described below with the reference to FIGS. 2 and 3. The current mode driver 120 is further described below with the reference to FIGS. 4 and 5.

The first voltage difference may be equal to or less than the second voltage difference responsive to the current mode driver 120 not operating and the voltage mode driver 110 operating. The term "operating" can mean actively producing one or more differential signals and/or operating according to an operational mode, as further described below.

Figure 2:
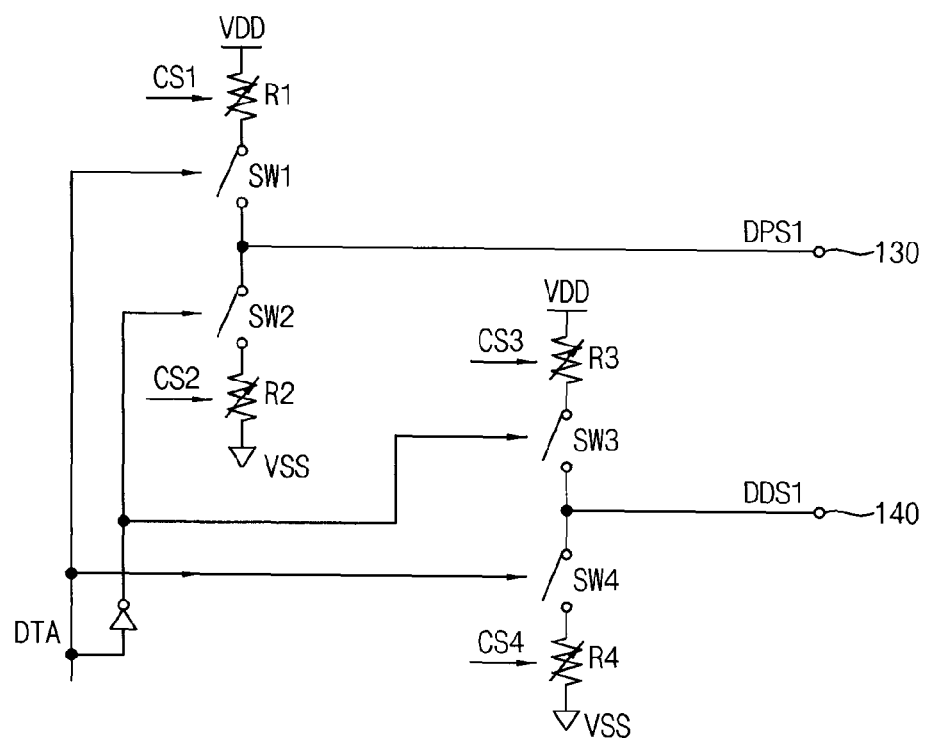
FIGS. 2 and 3 are diagrams illustrating example embodiments of the voltage mode driver included in the transceiver system of FIG. 1.
Figure 3:
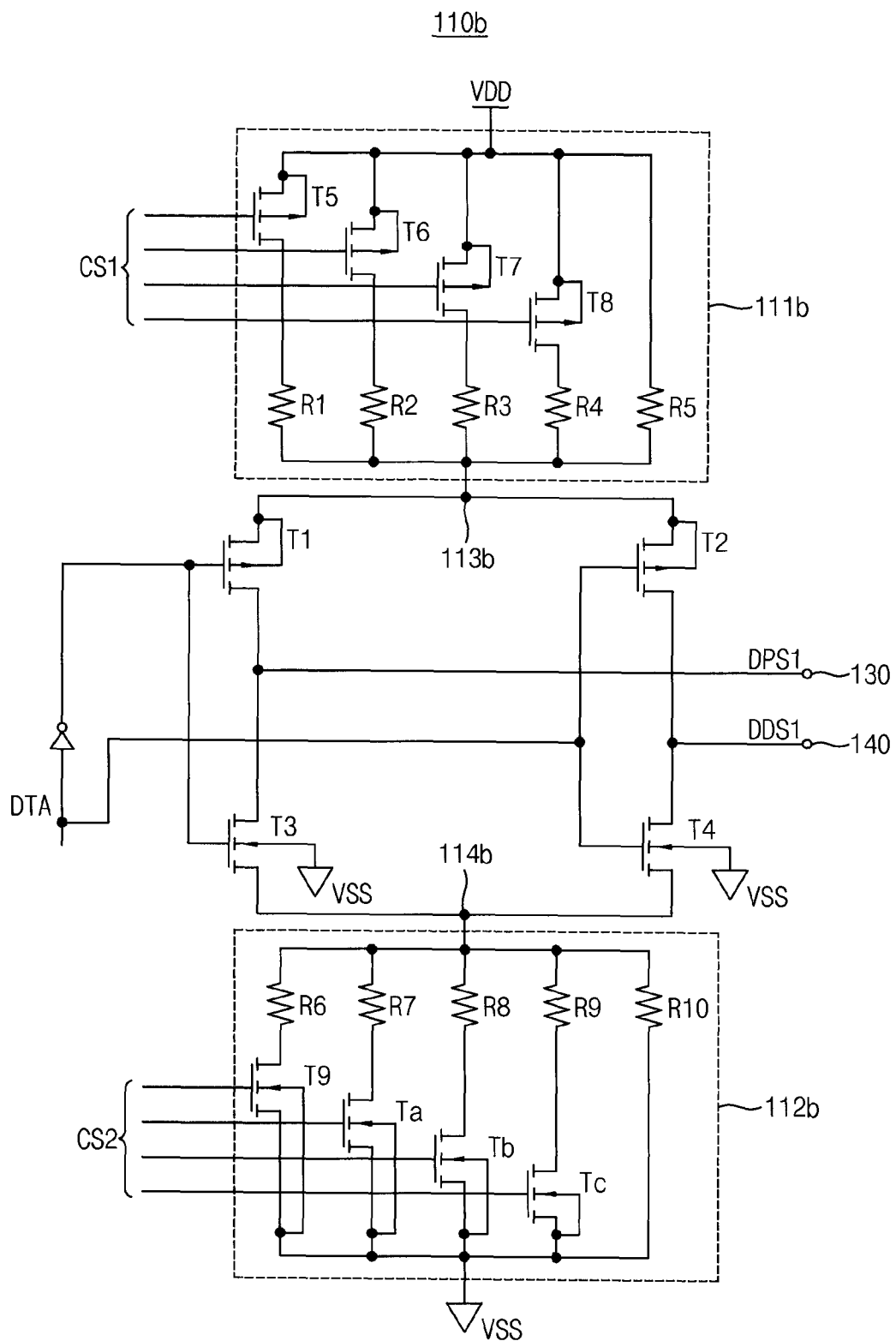

FIGS. 2 and 3 are diagrams illustrating example embodiments of the voltage mode driver included in the transceiver system of FIG. 1.

Referring to FIG. 2, a voltage mode driver 110a may include a first switch SW1, a second switch SW2, a third switch SW3, and a fourth switch SW4. A terminal of the first switch SW1 may be connected to the driving voltage source VDD through a first variable resistor R1, and another terminal of the first switch SW1 may be connected to the positive differential node 130. A terminal of the second switch SW2 may be connected to the ground node VSS through a second variable resistor R2, and another terminal of the second switch SW2 may be connected to the positive differential node 130. A terminal of the third switch SW3 may be connected to the driving voltage source VDD through a third variable resistor R3, and another terminal of the third switch SW3 may be connected to the negative differential node 140. A terminal of the fourth switch SW4 may be connected to the ground node VSS through a fourth variable resistor R4, and another terminal of the fourth switch SW4 may be connected to the negative differential node 140.

The first switch SW1 and the fourth switch SW4 may operate based at least on the input signal DTA. The second switch SW2 and the third switch SW3 may operate based at least on an inverted signal of the input signal DTA. Two terminals of the first switch SW1 may be electrically connected responsive to the input signal DTA having a logical high value, and may be electrically disconnected responsive to the input signal DTA having a logical low value.

Two terminals of the second switch SW2 may be electrically connected responsive to the inverted signal of the input signal DTA having a logical high value (i.e., responsive to the pre-inverted DTA signal having a logical low value), and may be electrically disconnected responsive to the inverted signal of the input signal DTA having a logical low value (i.e., responsive to the pre-inverted DTA signal having a logical high value).

Two terminals of the third switch SW3 may be electrically connected responsive to the inverted signal of the input signal DTA having a logical high value (i.e., responsive to the pre-inverted DTA signal having a logical low value), and may be electrically disconnected responsive to the inverted signal of the input signal DTA having a logical low value (i.e., responsive to the pre-inverted DTA signal having a logical high value).

Two terminals of the fourth switch SW4 may be electrically connected responsive to the input signal DTA having a logical high value, and may be electrically disconnected responsive to the input signal DTA having a logical low value.

Responsive to the input signal DTA having a logical high value, the two terminals of the first switch SW1 are electrically connected, the two terminals of the fourth switch SW4 are electrically connected, the two terminals of the second switch SW2 are electrically disconnected, and the two terminals of the third switch SW3 are electrically disconnected. Consequently, the first positive differential signal DPS1 may be transmitted from the driving voltage source VDD to the positive differential node 130 through the first variable resistor R1 and the first switch SW1. In addition, the first negative differential signal DDS1 may be transmitted from the negative differential node 140 to the ground node VSS through the fourth switch SW4 and the fourth variable resistor R4.

Responsive to the input signal DTA has a logical low value, the two terminals of the first switch SW1 are electrically disconnected, the two terminals of the fourth switch SW4 are electrically disconnected, the two terminals of the second switch SW2 are electrically connected, and the two terminals of the third switch SW3 are electrically connected. Consequently, the first positive differential signal DPS1 may be transmitted from the positive differential node 130 to the ground node VSS through the second switch SW2 and the second variable resistor R2. In addition, the first negative differential signal DDS1 may be transmitted from the driving voltage source VDD to the negative differential node 140 through the third variable resistor R3 and the third switch SW3.

Resistance between two terminals of the first variable resistor R1 may be changed based at least on a first control signal CS1. Similarly, resistance between two terminals of each of the second variable resistor R2, the third variable resistor R3, and the fourth variable resistor R4 may be changed based at least on a second control signal CS2, a third control signal CS3, and a fourth control signal CS4, respectively.

Referring to FIG. 3, a voltage mode driver 110b may include a first common variable resistor 111b, a second common variable resistor 112b, a first transistor T1, a second transistor T2, a third transistor T3, and a fourth transistor T4. Substrates of transistors T5, T6, T7, and T8 are electrically connected to the driving voltage source VDD, and the substrates of transistors T9, Ta, Tb, and Tc are electrically connected to the ground node VSS. Substrates of transistors T1 and T2 are electrically connected to a first node 113b, and substrates of transistors T3 and T4 are electrically connected to the ground node VSS.

The first common variable resistor 111b may include a first resistor R1, a second resistor R2, a third resistor R3, a fourth resistor R4, a fifth resistor R5, a fifth transistor T5, a sixth transistor T6, a seventh transistor T7, and an eighth transistor T8. A source terminal of the fifth transistor T5 may be electrically connected to the driving voltage source VDD. A drain terminal of the fifth transistor T5 may be electrically connected to a terminal of the first resistor R1. The other terminal of the first resistor R1 may be electrically connected to the first node 113b. A source terminal of the sixth transistor T6 may be electrically connected to the driving voltage source VDD. A drain terminal of the sixth transistor T6 may be electrically connected to a terminal of the second resistor R2. The other terminal of the second resistor R2 may be electrically connected to the first node 113b.

A source terminal of the seventh transistor T7 may be electrically connected to the driving voltage source VDD. A drain terminal of the seventh transistor T7 may be electrically connected to a terminal of the third resistor R3. The other terminal of the third resistor R3 may be electrically connected to the first node 113b. A source terminal of the eighth transistor T8 may be electrically connected to the driving voltage source VDD. A drain terminal of the eighth transistor T8 may be electrically connected to a terminal of the fourth resistor R4. The other terminal of the fourth resistor R4 may be electrically connected to the first node 113b. A terminal of the fifth resistor R5 may be electrically connected to the driving voltage source VDD. The other terminal of the fifth transistor R5 may be electrically connected to the first node 113b.

Resistance between two terminals of the first common variable resistor 111b may be changed based at least on one or more first control signals CS1, which may be included in the control signal CS of the transceiver system 100 of FIG. 1. Responsive to a control signal corresponding to the fifth transistor T5 having a logical high value, the fifth transistor T5 may be turned off. Responsive to the control signal corresponding to the fifth transistor T5 having a logical low value, the fifth transistor T5 may be turned on. Responsive to a control signal corresponding to the sixth transistor T6 having a logical high value, the sixth transistor T6 may be turned off. Responsive to the control signal corresponding to the sixth transistor T6 having a logical low value, the sixth transistor T6 may be turned on.

Responsive to a control signal corresponding to the seventh transistor T7 having a logical high value, the seventh transistor T7 may be turned off. Responsive to the control signal corresponding to the seventh transistor T7 having a logical low value, the seventh transistor T7 may be turned on. Responsive to a control signal corresponding to the eighth transistor T8 having a logical high value, the eighth transistor T8 may be turned off. Responsive to the control signal cor-responding to the eighth transistor T8 having a logical low value, the eighth transistor T8 may be turned on. It will be understood that in alternative embodiments, the control signal having a logical high value may cause the corresponding transistor to be turned on, and the control signal having a logical low value may cause the corresponding transistor to be turned off.

As more transistors from among the transistors T5, T6, T7, and T8 are turned on, the resistance between two terminals of the first common variable resistor 111b is decreased. Output resistance of the positive differential node 130 of the voltage mode driver 110b may be controlled to achieve impedance-matching with a resistance of the receiving circuit 150 included in the transceiver system 100 of FIG. 1 by changing a resistance of the first common variable resistor 111b based at least on the first control signals CS1.

The second common variable resistor 112b may include a sixth resistor R6, a seventh resistor R7, an eighth resistor R8, a ninth resistor R9, a tenth resistor R10, a ninth transistor T9, a tenth transistor Ta, an eleventh transistor Tb, and a twelfth transistor Tc. A source terminal of the ninth transistor T9 may be electrically connected to the ground node VSS. A drain terminal of the ninth transistor T9 may be electrically connected to a terminal of the sixth resistor R6. The other terminal of the sixth resistor R6 may be electrically connected to the second node 114b. A source terminal of the tenth transistor Ta may be electrically connected to the ground node VSS. A drain terminal of the tenth transistor Ta may be electrically connected to a terminal of the seventh resistor R7. The other terminal of the seventh resistor R7 may be electrically connected to the second node 114b.

A source terminal of the eleventh transistor Tb may be electrically connected to the ground node VSS. A drain terminal of the eleventh transistor Tb may be electrically connected to a terminal of the eighth resistor R8. The other terminal of the eighth resistor R8 may be electrically connected to the second node 114b. A source terminal of the twelfth transistor Tc may be electrically connected to the ground node VSS. A drain terminal of the twelfth transistor Tc may be electrically connected to a terminal of the ninth resistor R9. The other terminal of the ninth resistor R9 may be electrically connected to the second node 114b. A terminal of the tenth resistor R10 may be electrically connected to the ground node VSS. The other terminal of the tenth transistor R10 may be electrically connected to the second node 114b.

Resistance between two terminals of the second common variable resistor 112b may be changed based at least on one or more a second control signals CS2, which may be included in the control signal CS of the transceiver system 100 of FIG. 1. Responsive to a control signal corresponding to the ninth transistor T9 having a logical high value, the ninth transistor T9 may be turned on. Responsive to the control signal corresponding to the ninth transistor T9 having a logical low value, the ninth transistor T9 may be turned off. Responsive to a control signal corresponding to the tenth transistor Ta having a logical high value, the tenth transistor Ta may be turned on. Responsive to the control signal corresponding to the tenth transistor Ta having a logical low value, the tenth transistor Ta may be turned off.

Responsive to a control signal corresponding to the eleventh transistor Tb having a logical high value, the eleventh transistor Tb may be turned on. Responsive to the control signal corresponding to the eleventh transistor Tb having a logical low value, the eleventh transistor Tb may be turned off. Responsive to a control signal corresponding to the twelfth transistor Tc having a logical high value, the twelfth transistor Tc may be turned on. Responsive to the control signal corresponding to the twelfth transistor Tc having a logical low value, the twelfth transistor Tc may be turned off. It will be understood that in alternative embodiments, the control signal having a logical high value may cause the corresponding transistor to be turned off, and the control signal having a logical low value may cause the corresponding transistor to be turned on.

As more transistors from among the transistors T9, Ta, Tb, and Tc are turned on, the resistance between two terminals of the second common variable resistor 112b is decreased. Output resistance of the negative differential node 140 of the voltage mode driver 110b may be controlled to achieve impedance-matching with a resistance of the receiving circuit 150 included in the transceiver system 100 of FIG. 1 by changing a resistance of the second common variable resistor 112b based at least on the second control signals CS2.

A source terminal of the first transistor T1 may be electrically connected to the first node 113b. A drain terminal of the first transistor T1 may be electrically connected to the positive differential node 130. The inverted signal of the input signal DTA is provided to a gate terminal of the first transistor T1. A source terminal of the second transistor T2 may be electrically connected to the first node 113b. A drain terminal of the second transistor T2 may be electrically connected to the negative differential node 140. The input signal DTA is provided to a gate terminal of the second transistor T2.

A source terminal of the third transistor T3 may be electrically connected to the second node 114b. A drain terminal of the third transistor T3 may be electrically connected to the positive differential node 130. The inverted signal of the input signal DTA is provided to a gate terminal of the third transistor T3. A source terminal of the fourth transistor T4 may be electrically connected to the second node 114b. A drain terminal of the fourth transistor T4 may be electrically connected to the negative differential node 140. The input signal DTA is provided to a gate terminal of the fourth transistor T4.

Responsive to the input signal DTA having a logical high value, the first transistor T1 and the fourth transistor T4 are turned on, the second transistor T2 and the third transistor T3 are turned off, and the first positive differential signal DPS1 may be transmitted from the driving voltage source VDD to the positive differential node 130 through the first common variable resistor 111b, the first node 113b, and the first transistor T1. In addition, the first negative differential signal DDS1 may be transmitted from the negative differential node 140 to the ground node VSS through the fourth transistor T4, the second node 114b, and the second common variable resistor 112b.

Responsive to the input signal DTA having a logical low value, the second transistor T2 and the third transistor T3 are turned on, the first transistor T1 and the fourth transistor T4 are turned off, and the first negative differential signal DDS1 may be transmitted from the driving voltage source VDD to the negative differential node 140 through the first common variable resistor 111b, the first node 113b, and the second transistor T2. In addition, the first positive differential signal DPS1 may be transmitted from the positive differential node 130 to the ground node VSS through the third transistor T3, the second node 114b, and the second common variable resistor 112b.

Figure 4:
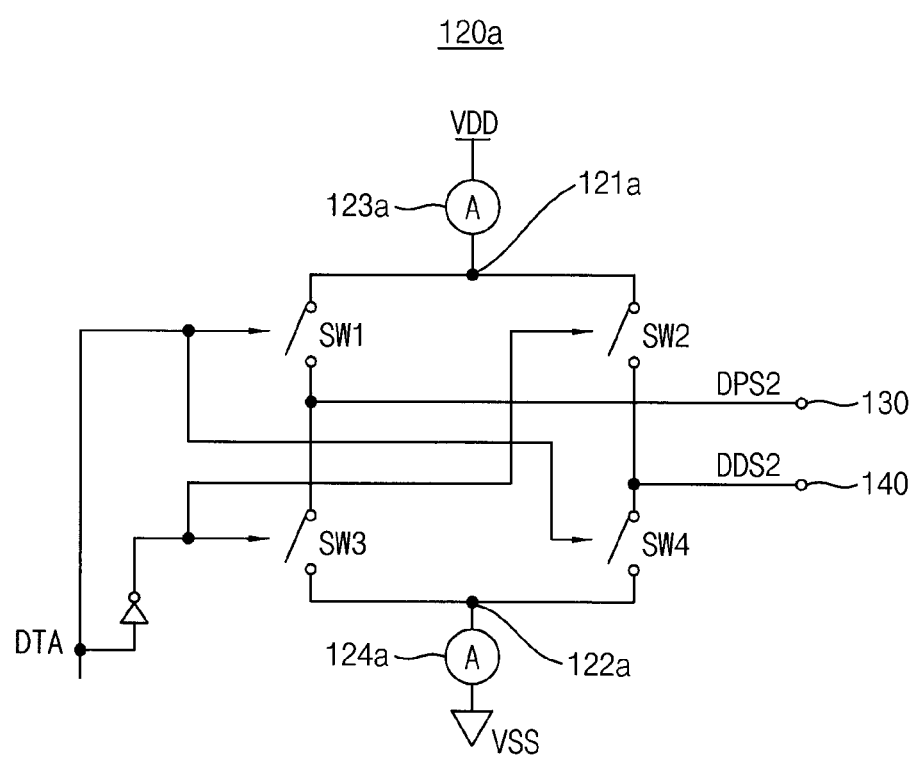
FIGS. 4 and 5 are diagrams illustrating example embodiments of the current mode driver included in the transceiver system of FIG. 1.
Figure 5:
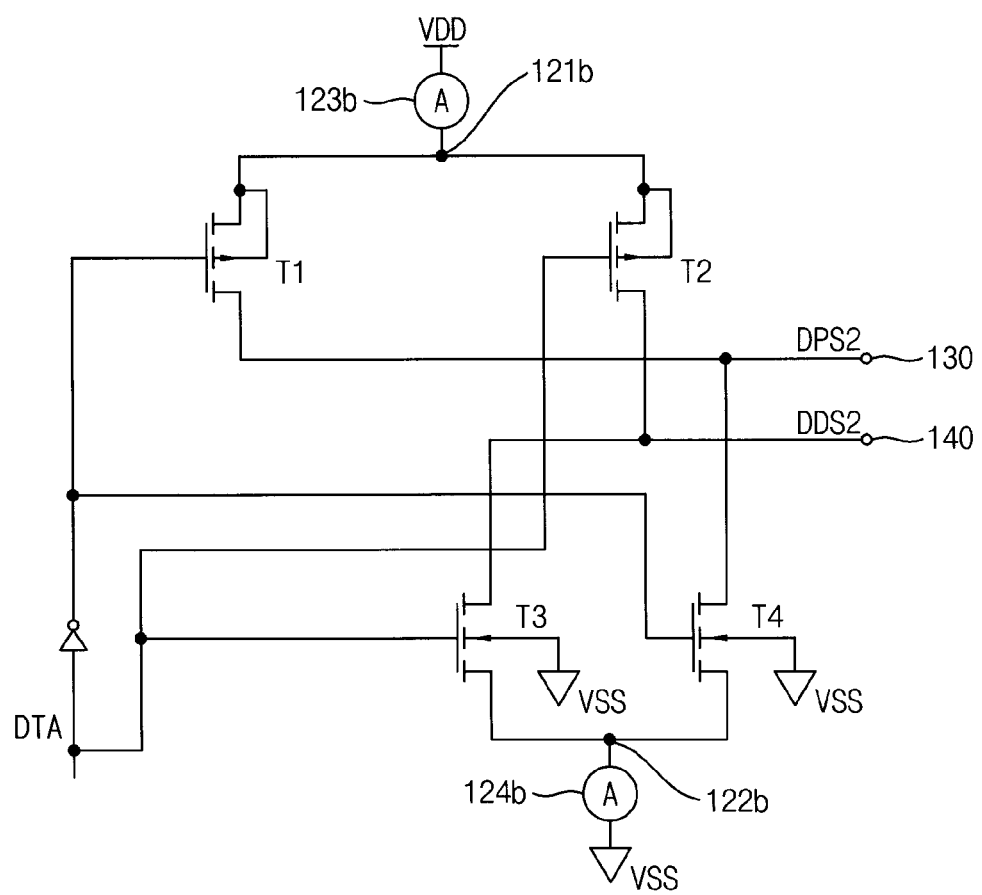

FIGS. 4 and 5 are diagrams illustrating example embodiments of the current mode driver included in the transceiver system of FIG. 1.

Referring to FIG. 4, a current mode driver 120a may include a first switch SW1, a second switch SW2, a third switch SW3, a fourth switch SW4, a first current source 123a, and a second current source 124a. A terminal of the first current source 123a may be electrically connected to the driving voltage source VDD. The other terminal of the first current source 123a may be electrically connected to the first node 121a. A terminal of the second current source 124a may be electrically connected to the ground node VSS. The other terminal of the second current source 124a may be electrically connected to the second node 122a.

A terminal of the first switch SW1 may be electrically connected to the first node 121a. The other terminal of the first switch SW1 may be electrically connected to the positive differential node 130. A terminal of the switch SW2 may be electrically connected to the first node 121a. The other terminal of the second switch SW2 may be electrically connected to the negative differential node 140. A terminal of the third switch SW3 may be electrically connected to the second node 122a. The other terminal of the third switch SW3 may be electrically connected to the positive differential node 130. A terminal of the fourth switch SW4 may be electrically connected to the second node 122a. The other terminal of the fourth switch SW4 may be electrically connected to the negative differential node 140.

The first switch SW1 may operate based at least on the input signal DTA. Responsive to the input signal DTA having a logical high value, two terminals of the first switch SW1 may be electrically connected. Responsive to the input signal DTA having a logical low value, the two terminals of the first switch SW1 may be disconnected. The second switch SW2 may operate based at least on the inverted signal of the input signal DTA. Responsive to the input signal DTA having a logical high value, two terminals of the second switch SW2 may be electrically disconnected. Responsive to the input signal DTA having a logical low value, the two terminals of the second switch SW2 may be electrically connected.

The third switch SW3 may operate based at least on the inverted signal of the input signal DTA. Responsive to the input signal DTA having a logical high value, two terminals of the third switch SW3 may be electrically disconnected. Responsive to the input signal DTA having a logical low value, the two terminals of the third switch SW3 may be electrically connected. The fourth switch SW4 may operate based at least on the input signal DTA. Responsive to the input signal DTA having a logical high value, two terminals of the fourth switch SW4 may be electrically connected. Responsive to the input signal DTA having a logical low value, the two terminals of the fourth switch SW4 may be disconnected.

Responsive to the input signal DTA having a logical high value, two terminals of the first switch SW1 are electrically connected, two terminals of the fourth switch SW4 are electrically connected, two terminals of the second switch SW2 are electrically disconnected, and two terminals of the third switch SW3 are electrically disconnected. Consequently, the second positive differential signal DPS2 may be transmitted from the first current source 123a to the positive differential node 130 through the first node 121a and the first switch SW1. In addition, the second negative differential signal DDS2 may be transmitted from the negative differential node 140 to the second current source 124a through the fourth switch SW4 and the second node 122a.

Responsive to the input signal DTA having a logical low value, two terminals of the second switch SW2 may be connected, two terminals of the third switch SW3 may be connected, two terminals of the first switch SW1 may be disconnected, and two terminals of the fourth switch SW4 may be disconnected. Consequently, the second negative differential signal DDS2 may be transmitted from the first current source 123a to the negative differential node 140 through the first node 121a and the second switch SW2, and the second positive differential signal DPS2 may be transmitted from the positive differential node 130 to the second current source 124a through the third switch SW3 and the second node 122a.

Referring to FIG. 5, a current mode driver 120b may include a first transistor T1, a second transistor T2, a third transistor T3, and a fourth transistor T4. In addition, the current mode driver 120b may include a first current source 123b and a second current source 124b.

A terminal of the first current source 123b may be electrically connected to the driving voltage source VDD. The other terminal of the first current source 123b may be electrically connected to a first node 121b. A terminal of the second current source 124b may be electrically connected to the ground node VSS. The other terminal of the second current source 124b may be electrically connected to a second node 122b. Substrates of a first transistor T1 and a second transistor T2 may be electrically connected to the first node 121b. Substrates of a third transistor T3 and a fourth transistor T4 may be electrically connected to the ground node VSS.

A source terminal of the first transistor T1 may be electrically connected to the first node 121b. A drain terminal of the first transistor T1 may be electrically connected to the positive differential node 130. The inverted signal of the input signal DTA may be provided to a gate terminal of the first transistor T1. A source terminal of the second transistor T2 may be electrically connected to the first node 121b. A drain terminal of the second transistor T2 may be electrically connected to the negative differential node 140. The input signal DTA may be provided to a gate terminal of the second transistor T2.

A source terminal of the third transistor T3 may be electrically connected to the second node 122b. A drain terminal of the third transistor T1 may be electrically connected to the negative differential node 140. The input signal DTA may be provided to a gate terminal of the third transistor T3. A source terminal of the fourth transistor T4 may be electrically connected to the second node 122b. A drain terminal of the second transistor T2 may be electrically connected to the positive differential node 130. The inverted signal of the input signal DTA may be provided to a gate terminal of the fourth transistor T4.

Responsive to the input signal DTA having a logical low value, the first transistor T1 and the third transistor T3 are turned off, and the second transistor T2 and the fourth transistor T4 are turned on. Consequently, the second positive differential signal DPS2 may be transmitted from the positive differential node 130 to the second current source 124b through the fourth transistor T4 and the second node 122b. In addition, the second negative differential signal DDS2 may be transmitted from the first current source 123b to the negative differential node 140 through the first node 121b and the second transistor T2.

Responsive to the input signal DTA having a logical high value, the first transistor T1 and the third transistor T3 are turned on, and the second transistor T2 and the fourth transistor T4 are turned off. Consequently, the second positive differential signal DPS2 may be transmitted from the first current source 123b to the positive differential node 130 through the first node 121b and the first transistor T1. In addition, the second negative differential signal DDS2 may be transmitted from the negative differential node 140 to the second current source 124b through the third transistor T3 and the second node 122b.

Figure 6:
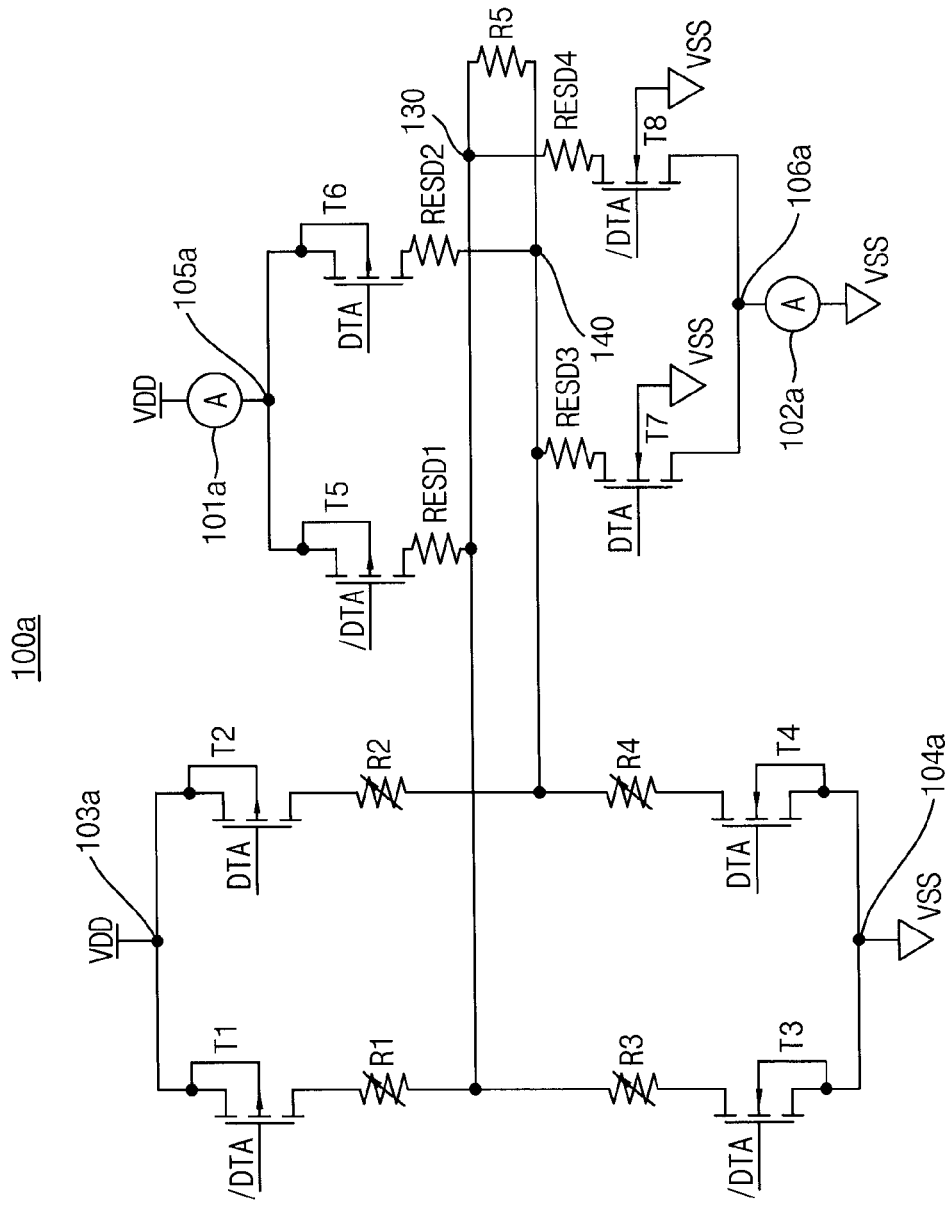
FIG. 6 is a block diagram illustrating a transceiver system according to an example embodiment.

FIG. 6 is a block diagram illustrating a transceiver system according to an example embodiment.

Referring to FIG. 6, a transceiver system 100a may include transistors T1, T2, T3, T4, T5, T6, T7, and T8, a first current source 101a, a second current source 102a, variable resistors R1, R2, R3, and R4, and a load resistor R5. The load resistor R5 represents resistance of the receiving circuit 150 (of FIG. 1). The transceiver system 100a may further include electrostatic discharge protection resistors RESD1, RESD2, RESD3, and RESD4. For convenience of description, following describes the transceiver system 100a without the electrostatic discharge protection resistors RESD1, RESD2, RESD3, and RESD4.

Substrates of transistors T1 and T2 may be electrically connected to a first node 103a. Substrates of transistors T5 and T6 may be electrically connected to a third node 105a. Substrates of transistors T3 and T4 may be electrically connected to a second node 104a. Substrates of transistors T7 and T8 may be electrically connected to the ground node VSS.

A source terminal of the first transistor T1 may be electrically connected to the first node 103a. A drain terminal of the first transistor T1 may be electrically connected to a terminal of a first variable resistor R1. The inverted signal of the input signal DTA may be provided to a gate terminal of the first transistor T1. The other terminal of the first variable resistor R1 may be electrically connected the positive differential node 130. A source terminal of the second transistor T2 may be electrically connected to the first node 103a. A drain terminal of the second transistor T2 may be electrically connected to a terminal of a second variable resistor R2. The input signal DTA may be provided to a gate terminal of the second transistor T2. The other terminal of the second variable resistor R2 may be electrically connected the negative differential node 140.

A source terminal of the third transistor T3 may be electrically connected to the second node 104a. A drain terminal of the third transistor T3 may be electrically connected to a terminal of a third variable resistor R3. The inverted signal of the input signal DTA may be provided to a gate terminal of the third transistor T3. The other terminal of the third variable resistor R3 may be electrically connected the positive differential node 130. A source terminal of the fourth transistor T4 may be electrically connected to the second node 104a. A drain terminal of the fourth transistor T4 may be electrically connected to a terminal of a fourth variable resistor R4. The input signal DTA may be provided to a gate terminal of the fourth transistor T4. The other terminal of the fourth variable resistor R4 may be electrically contend the negative differential node 140.

A source terminal of the fifth transistor T5 may be electrically connected to the first current source 101a. A drain terminal of the fifth transistor T5 may be electrically connected to the positive differential node 130. The inverted signal of the input signal DTA may be provided to a gate terminal of the fifth transistor T5. A source terminal of the sixth transistor T6 may be electrically connected to the first current source 101a. A drain terminal of the sixth transistor T6 may be electrically connected to the negative differential node 140. The input signal DTA may be provided to a gate terminal of the sixth transistor T6.

A source terminal of the seventh transistor T7 may be electrically connected to the second current source 102a. A drain terminal of the seventh transistor T7 may be electrically connected to the negative differential node 140. The input signal DTA may be provided to a gate terminal of the seventh transistor T7. A source terminal of the eighth transistor T8 may be electrically connected to the second current source 102a. A drain terminal of the eighth transistor T8 may be electrically connected to the positive differential node 130. The inverted signal of the input signal DTA may be provided to a gate terminal of the eighth transistor T8. A terminal of the load resistor R5 may be connected to the positive differential node 130. The other terminal of the load resistor R5 may be connected to the negative differential node 140. In an example embodiment, the first electrostatic discharge protection resistor RESD1 may be disposed between the drain terminal of the fifth transistor T5 and the positive differential node 130, the second electrostatic discharge protection resistor RESD2 may be disposed between the drain terminal of the sixth transistor T6 and the negative differential node 140, the third electrostatic discharge protection resistor RESD3 may be disposed between the drain terminal of the seventh transistor T7 and the negative differential node 140, and the fourth electrostatic discharge protection resistor RESD4 may be disposed between the drain terminal of the eighth transistor T8 and the positive differential node 130.

Responsive to the input signal DTA having a logical low value, the second transistor T2, the third transistor T3, the sixth transistor T6, and the eighth transistor T8 are turned on, and the first transistor T1, the fourth transistor T4, the fifth transistor T5, and the seventh transistor T7 are turned off. The first negative differential signal may be transmitted from the driving voltage source VDD to the negative differential node 140 through the first node 103a, the second transistor T2, and the second variable resistor R2. The second negative differential signal may be transmitted from the first current source 101a to the negative differential node 140 through the third node 105a and the sixth transistor T6.

The first negative differential signal and the second negative differential signal may be merged to a first differential signal at the negative differential node 140. The first differential signal may be transmitted from the negative differential node 140 to the positive differential node 130 through the load resistor R5. The first differential signal may be separated into a first positive differential signal and a second positive differential signal at the positive differential node 130. The first positive differential signal may be transmitted to the ground node VSS through the third variable resistor R3, the third transistor T3, and the second node 104a. The second positive differential signal may be transmitted to the second current source 102a through the eighth transistor T8 and the fourth node 106a.

Responsive to the input signal DTA having a logical high value, the second transistor T2, the third transistor T3, the sixth transistor T6, and the eighth transistor T8 are turned off, and the first transistor T1, the fourth transistor T4, the fifth transistor T5, and the seventh transistor T7 are turned on. The first positive differential signal may be transmitted from the driving voltage source VDD to the positive differential node 130 through the first node 103a, the first transistor T1, the first variable resistor R1. The second positive differential signal may be transmitted from the first current source 101a to the positive differential node 130 through the third node 105a and the fifth transistor T5.

The first positive differential signal and the second positive differential signal may be merged into a second differential signal at the positive differential node 130. The second differential signal may be transmitted from the positive differential node 130 to the negative differential node 140 through the load resistor R5. The second differential signal may be separated to the first negative differential signal and the second negative differential signal at the negative differential node 140. The first negative differential signal may be transmitted to the ground node VSS through the fourth variable resistor R4, the fourth transistor T4, and the second node 104a. The second negative differential signal may be transmitted to the second current source 102a through the seventh transistor T7 and the fourth node 106a.

When resistance of the load resistor R5 is R, and impedance-matching is achieved, resistances of the first resistor R1, the second resistor R2, the third resistor R3, and the fourth resistor R4 are each R/2. The first resistor R1 and the second resistor R2 may be implemented with the first common variable resistor 111$b$ included in the voltage mode driver 110$b$ of FIG. 3. The third resistor R3 and the fourth resistor R4 may be implemented with the second common variable resistor 112$b$ included in the voltage mode driver 110$b$ of FIG. 3.

When currents of the first current source 101$a$ and the second current source 102$a$ are I respectively, a voltage VP of the positive differential node 130 is 0.75*VDD+(R/4)*I(V). Moreover, a voltage VN of the negative differential node 140 is 0.25*VDD−(R/4)*I. Swing width of the differential signal between the positive differential node 130 and the negative differential node 140 is 2*|VP−VN|=VDD+R*I. In a conventional transceiver system using a conventional voltage mode driver, current of the receiving circuit is VDD/R, and a swing width of the differential signal between the positive differential node and the negative differential node is VDD.

Conversely, in the transceiver system 100$a$ according to an example embodiment, when I is VDD/R, I flows through the receiving circuit R5, thus the voltage at positive differential node 130 is equal to VDD, in the meantime the voltage at negative differential node 140 is 0 (in ideal case if the voltage drop on T5, T6, T7, T8 transistors and 101$a$, 102$a$ current sources is equal to 0) and the differential swing width of the differential signal between the positive differential node 130 and the negative differential node 140 may be 2*VDD. The current drawn by the voltage mode driving part (T1,T2,T3,T4 and R1,R2,R3,R4) of the transceiver system 100$a$ for described conditions is equal to 0. Thus the transceiver system 100$a$ consumes the same current as a conventional transceiver system using a conventional voltage mode driver, in the meantime providing twice larger differential voltage swing at the output.

Figure 7:
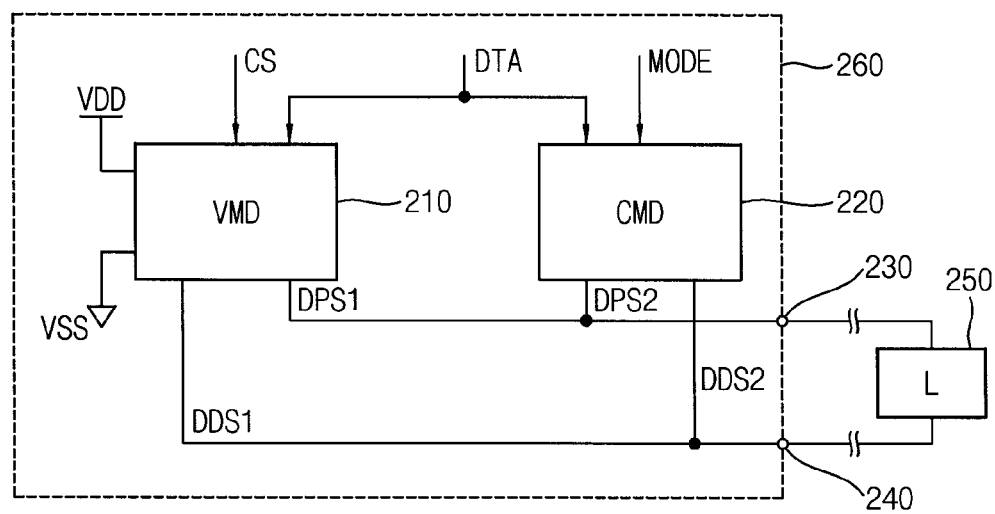
FIG. 7 is a block diagram illustrating a transceiver system according to another example embodiment.

FIG. 7 is a block diagram illustrating a transceiver system according to another embodiment of the inventive concept Referring to FIG. 7, a transceiver system 200 includes a transmitting circuit 260 and a receiving circuit 250. The transmitting circuit 260 includes a positive differential node 230, a negative differential node 240, a voltage mode driver VMD 210, and a current mode driver CMD 220. The voltage mode driver 210 may generate a first positive differential signal DPS1 and a first negative differential signal DDS1. The current mode driver 220 may generate a second positive differential signal DPS2 and a second negative differential signal DDS2.

A first voltage difference between the positive differential node 230 and the negative differential node 240 is greater than a second voltage difference between the driving voltage source VDD and the ground node VSS responsive to both the current mode driver 120 and the voltage mode driver 110 operating. The first voltage difference is equal to or less than the second voltage difference responsive to only the voltage mode driver 110 operating, but the current mode driver 120 not operating, according to a mode signal MODE.

Figure 8:
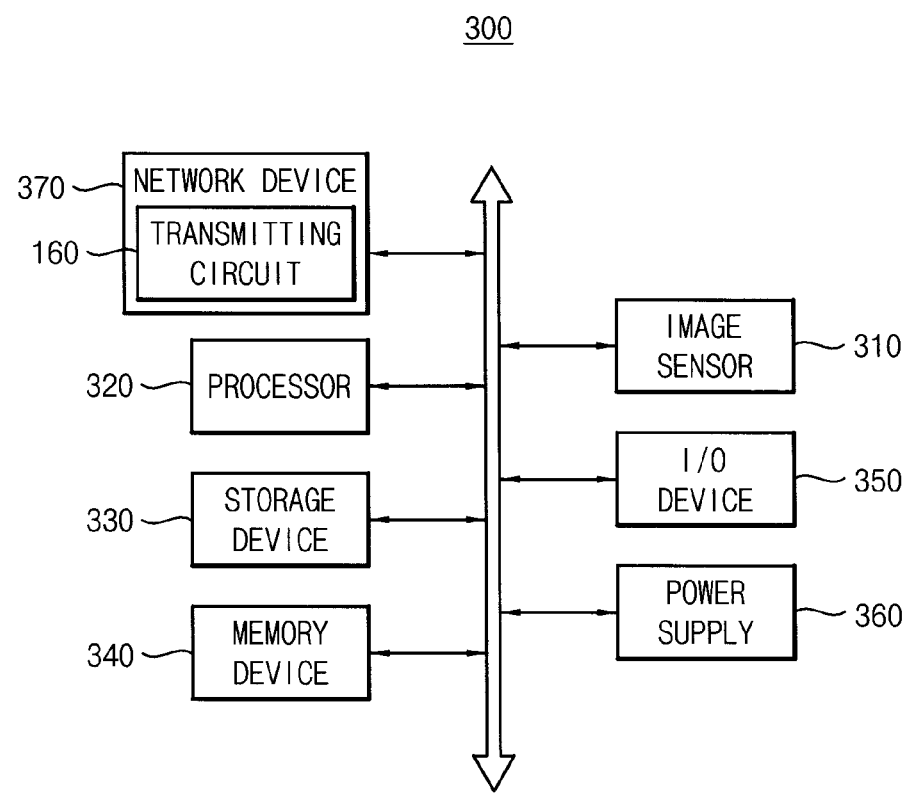
FIG. 8 is a block diagram illustrating a computing system according to an example embodiment.

FIG. 8 is a block diagram illustrating a computing system according to an example embodiment.

Referring to FIG. 8, a computing system 300 may include an image sensor 310, a processor 320, a storage device 330, and a network device 370. The image sensor 310 may generate a digital signal corresponding to an incident light. The storage device 330 may store the digital signal. The processor 320 may control operations of the image sensor 310, the network device 370, and/or the storage device 330.

The computing system 300 may further include a memory device 340, an input/output device 350 and a power supply 360. Although it is not illustrated in FIG. 8, the computing system 300 may further include ports that communicate with a video card, a sound card, a memory card, a universal serial bus (USB) device, or other electronic devices.

The processor 320 may perform various calculations or tasks. According to some embodiments, the processor 320 may be a microprocessor or a CPU. The processor 320 may communicate with the storage device 330, the memory device 340, the network device 370, and the input/output device 350 via an address bus, a control bus, and/or a data bus. In some example embodiments, the processor 320 may be coupled to an extended bus, such as a peripheral component interconnection (PCI) bus.

The storage device 330 may include a non-volatile memory device such as a flash memory device, a solid state drive (SSD), a hard disk drive (HDD), a compact disk read-only memory (CD-ROM) drive, etc.

The memory device 340 may store data required for an operation of the electronic device 300. The memory device 340 may be a dynamic random access memory (DRAM), a static random access memory (SRAM), or a non-volatile memory, such as an erasable programmable read-only memory (EPROM), an electrically erasable programmable read-only memory (EEPROM), a flash memory, etc.

The input/output device 350 may include a keyboard, a mouse, a printer, a display device, etc. The power supply 360 may supply operational power.

The image sensor 310 may be connected to the processor 320 through one or more of the above buses or other communication links to communicate with the processor 320. The image sensor 310 may include a pixel array that detects incident light to generate an analog signal, and an analog-digital conversion unit that performs a sigma-delta analog-digital conversion and a cyclic analog-digital conversion with respect to the analog signal to generate a digital signal in a first operation mode and performs a single-slope analog-digital conversion with respect to the analog signal to generate the digital signal in a second operation mode.

The image sensor 310 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The network device 370 may include the transmitting circuit 160 included in the transceiver system 100 of FIG. 1. The network device 370 may transmit data of the processor 320, the image sensor 310, the storage device 330, the memory device 340, and/or the input/output device 350 to other computing system. The network device 370 may receive data from the other computing system.

According to example embodiments, the image sensor 310 may be integrated with the processor 320 in one chip, or alternatively, the image sensor 310 and the processor 320 may be implemented as separate chips.

The computing system 300 may be any computing system using an image sensor. For example, the computing system 300 may include a digital camera, a mobile phone, a smart phone, a portable multimedia player (PMP), a personal digital assistant (PDA), etc.

Figure 9:
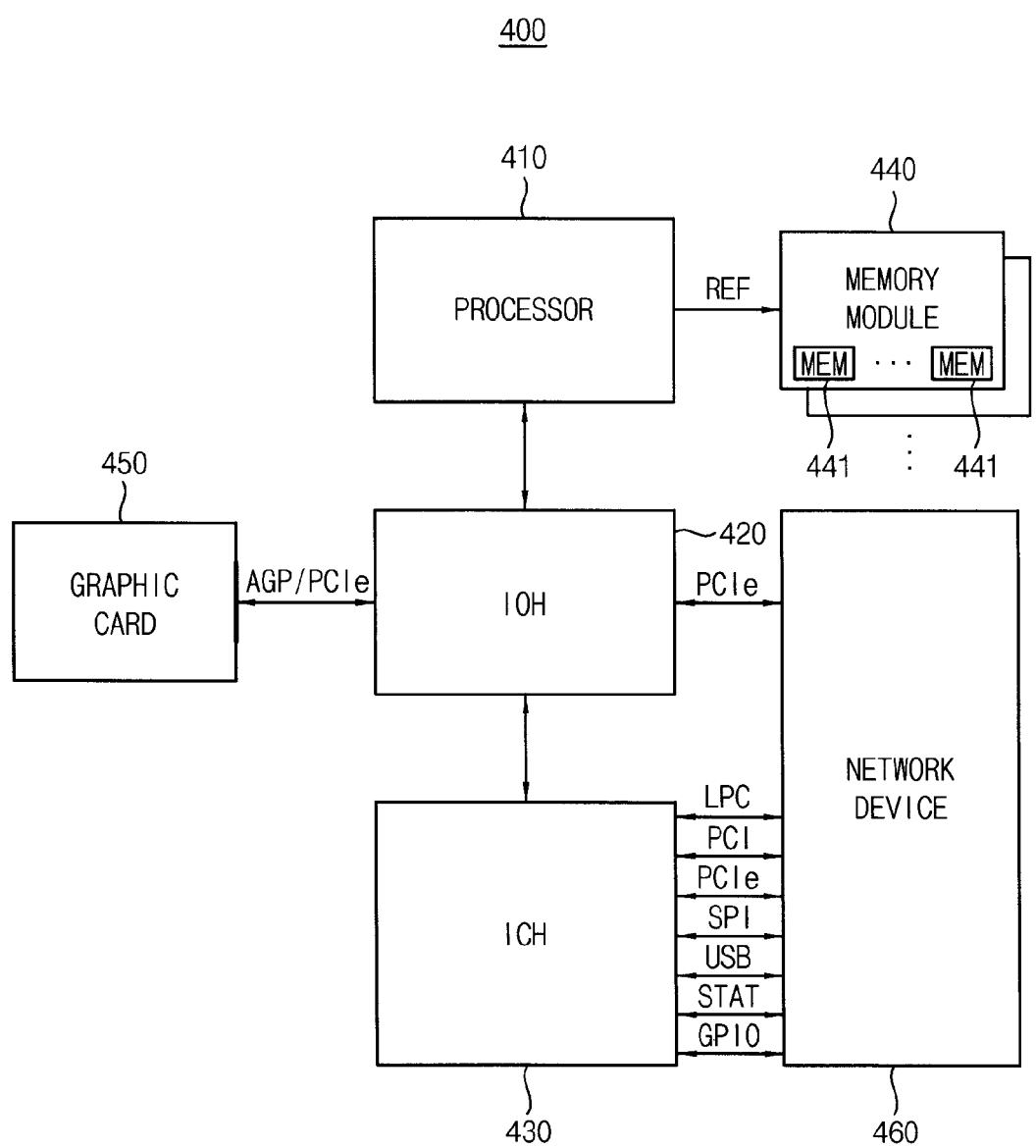
FIG. 9 is a block diagram illustrating a transceiver system according to an example embodiment as applied to a computing system.

FIG. 9 is a diagram illustrating an example embodiment that a transceiver system according to an example embodiment is applied to a computing system.

Referring to FIG. 9, a computing system 400 includes a processor 410, an input/output hub (IOH) 420, an input/output controller hub (ICH) 430, at least one memory module 440, a network device 460, and a graphics card 450. In some embodiments, the computing system 400 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 410 may perform various computing functions, such as executing specific software for performing specific calculations or tasks. For example, the processor 410 may be a microprocessor, a central process unit (CPU), a digital signal processor, or the like. In some embodiments, the processor 410 may include a single core or multiple cores. For example, the processor 410 may be a multi-core processor, such as a dual-core processor, a quad-core processor, a hexa-core processor, etc. Although FIG. 9 illustrates the computing system 400 including one processor 410, in some embodiments, the computing system 400 may include a plurality of processors.

The processor 410 may include a memory controller for controlling operations of the memory module 440. The memory controller included in the processor 410 may be referred to as an integrated memory controller (IMC). A memory interface between the memory controller and the memory module 440 may be implemented with a single channel including a plurality of signal lines, or may bay be implemented with multiple channels, to each of which at least one memory module 440 may be coupled. In some embodiments, the memory controller may be located inside the input/output hub 420. The input/output hub 420 including the memory controller may be referred to as memory controller hub (MCH).

The memory module 440 may include a plurality of memory devices MEM 441 that store data provided from the memory controller. Each of memory cells included in the memory device 441 may include a write transistor, a read transistor, and a metal oxide semiconductor (MOS) capacitor. The write transistor may include a gate electrode coupled to a write word line, a first electrode coupled to a write bit line and a second electrode coupled to a storage node. The read transistor may include a gate electrode coupled to the storage node, a first electrode coupled to a read word line and a second electrode coupled to a read bit line. The MOS capacitor may include a gate electrode coupled to the storage node and a lower electrode coupled to a synchronization control line.

A synchronization pulse signal may be applied to the lower electrode of the MOS capacitor in synchronization with a write word line signal in a write operation and applied to the lower electrode of the MOS capacitor in synchronization with a read word line signal in a read operation such that a coupling effect may occur at the storage node through the MOS capacitor in response to the synchronization pulse signal. Therefore, a data retention time of the memory cell included in the memory device 441 may increase. As such, the memory device 441 may have a longer data retention time than a dynamic random access memory (DRAM) and a higher density than a static random access memory (SRAM).

The input/output hub 420 may manage data transfer between processor 410 and devices, such as the graphics card 450. The input/output hub 420 may be coupled to the processor 410 via various interfaces. For example, the interface between the processor 410 and the input/output hub 420 may be a front side bus (FSB), a system bus, a HyperTransport, a lightning data transport (LDT), a QuickPath interconnect (QPI), a common system interface (CSI), etc. The input/output hub 420 may provide various interfaces with the devices. For example, the input/output hub 420 may provide an accelerated graphics port (AGP) interface, a peripheral component interface-express (PCIe), a communications streaming architecture (CSA) interface, etc. Although FIG. 9 illustrates the computing system 400 including one input/output hub 420, in some embodiments, the computing system 400 may include a plurality of input/output hubs.

The graphics card 450 may be coupled to the input/output hub 420 via AGP or PCIe. The graphics card 450 may control a display device for displaying an image. The graphics card 450 may include an internal processor for processing image data and an internal memory device. In some embodiments, the input/output hub 420 may include an internal graphics device along with or instead of the graphics card 450 outside the graphics card 450. The graphics device included in the input/output hub 420 may be referred to as integrated graphics. Further, the input/output hub 420 including the internal memory controller and the internal graphics device may be referred to as a graphics and memory controller hub (GMCH).

The input/output controller hub 430 may perform data buffering and interface arbitration to efficiently operate various system interfaces. The input/output controller hub 430 may be coupled to the input/output hub 420 via an internal bus, such as a direct media interface (DMI), a hub interface, an enterprise Southbridge interface (ESI), PCIe, etc.

The input/output controller hub 430 may provide various interfaces with peripheral devices. For example, the input/output controller hub 430 may provide a universal serial bus (USB) port, a serial advanced technology attachment (SATA) port, a general purpose input/output (GPIO), a low pin count (LPC) bus, a serial peripheral interface (SPI), PCI, PCIe, etc.

The network device 460 may include the transmitting circuit 160 included in the transceiver system 100 of FIG. 1. The network device 460 may receive data of the processor 410 and the graphics card 450 through the PCI express of the input/output hub 420 or one of the USB port, the SATA port, the GPIO, the LPC bus, the SPI, the PCI, and the PCIe. The network device 460 may transmit the data to the other computing system. The network device 460 may receive other data from the other computing system.

In some embodiments, the processor 410, the input/output hub 420 and the input/output controller hub 430 may be implemented as separate chipsets or separate integrated circuits. In other embodiments, at least two of the processor 410, the input/output hub 420 and the input/output controller hub 430 may be implemented as a single chipset.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A transmitting circuit comprising:
a positive differential node and a negative differential node;
a voltage mode driver connected to the positive differential node and to the negative differential node, and configured to generate a first positive differential signal and a first negative differential signal, based at least on an input signal, by using a driving voltage source, the voltage mode driver configured to provide the first positive differential signal to the positive differential node and to provide the first negative differential signal to the negative differential node; and
a current mode driver connected to the positive differential node and to the negative differential node, and configured to generate a second positive differential signal and a second negative differential signal, based at least on the input signal, the current mode driver configured to provide the second positive differential signal to the positive differential node and to provide the second negative differential signal to the negative differential node,
wherein responsive to both the current mode driver and the voltage mode driver operating, the positive differential node and the negative differential node are configured to have a differential signal voltage swing width between the positive differential node and the negative differential node that is greater than a voltage difference between the driving voltage source and a ground node, and
responsive to one of the current mode driver or the voltage mode driver operating, the positive differential node and the negative differential node are configured to have the differential signal voltage swing width between the positive differential node and the negative differential node that is equal to or less than the voltage difference between the driving voltage source and the ground node.

2. The transmitting circuit of claim 1, wherein:
the current mode driver includes a first current source, a second current source, a first switch, a second switch, a third switch, and a fourth switch,
a terminal of the first switch is connected to the first current source, and another terminal of the first switch is connected to the positive differential node,
a terminal of the second switch is connected to the first current source, and another terminal of the second switch is connected to the negative differential node,
a terminal of the third switch is connected to the second current source, and another terminal of the third switch is connected to the positive differential node, and
a terminal of the fourth switch is connected to the second current source, and another terminal of the fourth switch is connected to the negative differential node.

3. The transmitting circuit of claim 2, wherein the first and fourth switches operate based at least on the input signal, and the second and third switches operate based at least on an inverted signal of the input signal.

4. The transmitting circuit of claim 3, wherein each of the first, second, third, and fourth switches includes a transistor whose gate terminal receives the input signal or the inverted signal of the input signal.

5. The transmitting circuit of claim 1, wherein the voltage mode driver includes a first switch, a second switch, a third switch, and a fourth switch, wherein:
a terminal of the first switch is connected to the driving voltage source through a first variable resistor, and another terminal of the first switch is connected to the positive differential node,
a terminal of the second switch is connected to the ground node through a second variable resistor, and another terminal of the second switch is connected to the positive differential node,
a terminal of the third switch is connected to the driving voltage source through a third variable resistor, and another terminal of the third switch is connected to the negative differential node, and
a terminal of the fourth switch is connected to the ground node through a fourth variable resistor, and another terminal of the fourth switch is connected to the negative differential node.

6. The transmitting circuit of claim 5, wherein each of the first, second, third, and fourth switches includes a transistor.

7. The transmitting circuit of claim 5, wherein the first and fourth switches operate based at least on the input signal, and the second and third switches operate based at least on an inverted signal of the input signal.

8. The transmitting circuit of claim 5, wherein resistances of the first, second, third, and fourth variable resistors are configured to change based at least on a control signal.

9. The transmitting circuit of claim 1, wherein responsive to the current mode driver not operating and the voltage mode driver operating, the positive differential node and the negative differential node are configured to have the differential signal voltage swing width between the positive differential node and the negative differential node that is equal to or less than the voltage difference between the driving voltage source and the ground node.

10. A transceiver system comprising:
a receiving circuit; and
a transmitting circuit, including:
a positive differential node and a negative differential node;
a voltage mode driver connected to the positive differential node and to the negative differential node, and configured to generate a first positive differential signal and a first negative differential signal, based at least on an input signal, by using a driving voltage source, the voltage mode driver configured to provide the first positive differential signal to the positive differential node and to provide the first negative differential signal to the negative differential node; and
a current mode driver connected to the positive differential node and to the negative differential node, and configured to generate a second positive differential signal and a second negative differential signal, based at least on the input signal, the current mode driver configured to provide the second positive differential signal to the positive differential node and to provide the second negative differential signal to the negative differential node,
wherein responsive to both the current mode driver and the voltage mode driver operating, the positive differential node and the negative differential node are configured to have a differential signal voltage swing width between the positive differential node and the negative differential node that is greater than a voltage difference between the driving voltage source and a ground node, and
responsive to one of the current mode driver or the voltage mode driver operating, the positive differential node and the negative differential node are configured to have the differential signal voltage swing width between the positive differential node and the negative differential node that is equal to or less than the voltage difference between the driving voltage source and the ground node, wherein the receiving circuit is connected to the positive differential node and the negative differential node.

11. The transceiver system of claim 10, wherein the voltage mode driver includes a first, a second, a third, and a fourth switches, wherein:
- a terminal of the first switch is connected to the driving voltage source through a first variable resistor, and another terminal of the first switch is connected to the positive differential node,
- a terminal of the second switch is connected to the ground node through a second variable resistor, and another terminal of the second switch is connected to the positive differential node,
- a terminal of the third switch is connected to the driving voltage source through a third variable resistor, and another terminal of the third switch is connected to the negative differential node, and
- a terminal of the fourth switch is connected to the ground node through a fourth variable resistor, and another terminal of the fourth switch is connected to the negative differential node.

12. The transceiver system of claim 11, wherein resistances of the first, second, third, and fourth resistors are configured to be controlled, based at least on a control signal, to achieve impedance-matching with a resistance of the receiving circuit.

13. The transceiver system of claim 10, wherein responsive to the current mode driver not operating and the voltage mode driver operating, the positive differential node and the negative differential node are configured to have the differential signal voltage swing width between the positive differential node and the negative differential node that is equal to or less than the voltage difference between the driving voltage source and the ground node.

14. A transmitting circuit comprising:
- a driving voltage source;
- a ground node;
- a positive differential node;
- a negative differential node;
- a voltage mode driver connected to the positive differential node and to the negative differential node; and
- a current mode driver connected to the positive differential node and to the negative differential node,
- wherein responsive to both the current mode driver and the voltage mode driver operating, the positive differential node and the negative differential node are configured to have a differential signal voltage swing width between the positive differential node and the negative differential node that is greater than a voltage difference between the driving voltage source and the ground node, and
- responsive to only one of the current mode driver or the voltage mode driver operating, the positive differential node and the negative differential node are configured to have the differential signal voltage swing width between the positive differential node and the negative differential node that is equal to or less than the voltage difference between the driving voltage source and the ground node.

15. The transmitting circuit of claim 14, wherein:
the current mode driver includes a first current source, a second current source, a first switch, a second switch, a third switch, and a fourth switch,
- a terminal of the first switch is connected to the first current source, and another terminal of the first switch is connected to the positive differential node,
- a terminal of the second switch is connected to the first current source, and another terminal of the second switch is connected to the negative differential node,
- a terminal of the third switch is connected to the second current source, and another terminal of the third switch is connected to the positive differential node, and
- a terminal of the fourth switch is connected to the second current source, and another terminal of the fourth switch is connected to the negative differential node.

16. The transmitting circuit of claim 15, wherein the first and fourth switches operate based at least on an input signal, and the second and third switches operate based at least on an inverted signal of the input signal.

17. The transmitting circuit of claim 16, wherein each of the first, second, third, and fourth switches includes a transistor whose gate terminal receives the input signal or the inverted signal of the input signal.

18. The transmitting circuit of claim 14, wherein the voltage mode driver includes a first switch, a second switch, a third switch, and a fourth switch, and wherein:
- a terminal of the first switch is connected to the driving voltage source through a first variable resistor, and another terminal of the first switch is connected to the positive differential node,
- a terminal of the second switch is connected to the ground node through a second variable resistor, and another terminal of the second switch is connected to the positive differential node,
- a terminal of the third switch is connected to the driving voltage source through a third variable resistor, and another terminal of the third switch is connected to the negative differential node, and
- a terminal of the fourth switch is connected to the ground node through a fourth variable resistor, and another terminal of the fourth switch is connected to the negative differential node.

19. The transmitting circuit of claim 18, wherein each of the first, second, third, and fourth switches includes a transistor.

20. The transmitting circuit of claim 14, wherein responsive to the current mode driver not operating and the voltage mode driver operating, the positive differential node and the negative differential node are configured to have the differential signal voltage swing width between the positive differential node and the negative differential node that is equal to or less than the voltage difference between the driving voltage source and the ground node.

* * * * *